United States Patent
Sonoda et al.

(10) Patent No.: US 9,893,121 B2
(45) Date of Patent: Feb. 13, 2018

(54) MAGNETIC MEMORY AND METHOD OF MANUFACTURING MAGNETIC MEMORY

(71) Applicants: TOSHIBA MEMORY CORPORATION, Minato-ku, Tokyo (JP); SK HYNIX INC., Icheon-si, Gyeonggi-do (KR)

(72) Inventors: Yasuyuki Sonoda, Seoul (KR); Masahiko Nakayama, Seoul (KR); Min Suk Lee, Seongnam-si (KR); Masatoshi Yoshikawa, Seoul (KR); Kuniaki Sugiura, Seoul (KR); Ji Hwan Hwang, Dongjak-gu Seoul (KR)

(73) Assignees: Toshiba Memory Corporation, Tokyo (JP); SK Hynix, Inc., Gyeonggi-do (KR)

(*) Notice: Subject to any disclaimer, the term of this patent is extended or adjusted under 35 U.S.C. 154(b) by 0 days.

(21) Appl. No.: 15/257,112

(22) Filed: Sep. 6, 2016

(65) Prior Publication Data
US 2016/0380028 A1 Dec. 29, 2016

Related U.S. Application Data

(63) Continuation of application No. PCT/JP2014/067300, filed on Jun. 24, 2014.
(Continued)

(51) Int. Cl.
| | |
|---|---|
| H01L 27/22 | (2006.01) |
| H01L 43/02 | (2006.01) |
| H01L 43/08 | (2006.01) |
| H01L 43/12 | (2006.01) |
| G11C 11/16 | (2006.01) |

(52) U.S. Cl.
CPC .......... *H01L 27/228* (2013.01); *H01L 43/02* (2013.01); *H01L 43/08* (2013.01); *H01L 43/12* (2013.01); *G11C 11/161* (2013.01)

(58) Field of Classification Search
CPC ....... H01L 27/228; H01L 43/02; H01L 43/08; H01L 43/12; H01L 21/67;
(Continued)

(56) References Cited

U.S. PATENT DOCUMENTS

| | | |
|---|---|---|
| 6,998,665 B2 | 2/2006 | Motoyoshi |
| 7,015,524 B2 | 3/2006 | Ikeda |

(Continued)

FOREIGN PATENT DOCUMENTS

| | | |
|---|---|---|
| JP | 2001196659 A | 7/2001 |
| JP | 2012059805 A | 3/2012 |

(Continued)

OTHER PUBLICATIONS

International Search Report (ISR) and Written Opinion dated Sep. 16, 2014 issued in International Application No. PCT/JP2014/067300.

*Primary Examiner* — Shahed Ahmed
(74) *Attorney, Agent, or Firm* — Holtz Holtz & Volek PC

(57) ABSTRACT

According to one embodiment, a magnetic memory includes a first metal layer including a first metal, a second metal layer on the first metal layer, the second metal layer including a second metal which is more easily oxidized than the first metal, the second metal layer having a first sidewall portion which contacts the first metal layer, and the second metal layer having a second sidewall portion above the first sidewall portion, the second sidewall portion which steps back from the first sidewall portion, a magnetoresistive element on the second metal layer, a third metal layer on the magnetoresistive element, and a first material which contacts a sidewall portion of the magnetoresistive element and the second sidewall portion of the second metal layer, the first material including an oxide of the second metal.

18 Claims, 12 Drawing Sheets

Related U.S. Application Data

(60) Provisional application No. 61/951,414, filed on Mar. 11, 2014.

(58) Field of Classification Search
CPC . H01L 21/67709; H01L 27/22; H01L 27/222; H01L 29/82; H01L 27/209; H01L 41/06; H01L 41/12
USPC ............ 257/252, 295, 421, 422, 427; 438/3
See application file for complete search history.

(56) References Cited

U.S. PATENT DOCUMENTS

| | | |
|---|---|---|
| 2001/0024347 A1 | 9/2001 | Shimazawa et al. |
| 2006/0220084 A1 | 10/2006 | Umehara et al. |
| 2009/0251951 A1* | 10/2009 | Yoshikawa ............ B82Y 10/00 365/158 |
| 2012/0056253 A1 | 3/2012 | Iwayama et al. |
| 2012/0135543 A1 | 5/2012 | Shin et al. |
| 2012/0139019 A1 | 6/2012 | Iba |
| 2012/0326252 A1* | 12/2012 | Yamakawa ........... H01L 27/222 257/421 |
| 2013/0069182 A1* | 3/2013 | Ohsawa ................. H01L 29/82 257/421 |
| 2013/0307099 A1* | 11/2013 | Kitagawa ................ H01L 29/82 257/421 |
| 2013/0313506 A1 | 11/2013 | Murayama et al. |

FOREIGN PATENT DOCUMENTS

| | | |
|---|---|---|
| JP | 2012119564 A | 6/2012 |
| JP | 2012119684 A | 6/2012 |
| JP | 2013201343 A | 10/2013 |

\* cited by examiner

| | Present embodiment | Comparative example No.1 | Comparative example No.2 |
|---|---|---|---|
| Structure | | | |
| Method | Semi-sidewall process<br>① First etching process (IBE/RIE)<br>② Second etching process (IBE/RIE) | One etching process (IBE/RIE) | Stop on tunnel barrier process<br>① First etching process (IBE/RIE)<br>② Second etching process (IBE/RIE) |
| Characteristics | • No electrical short failure<br>• Improvement of MR ratio | • Electrical short failure by re-deposition of hardly oxidizable metal | • Degradation of MR ratio by big magnetic layer 12 |

F I G. 11

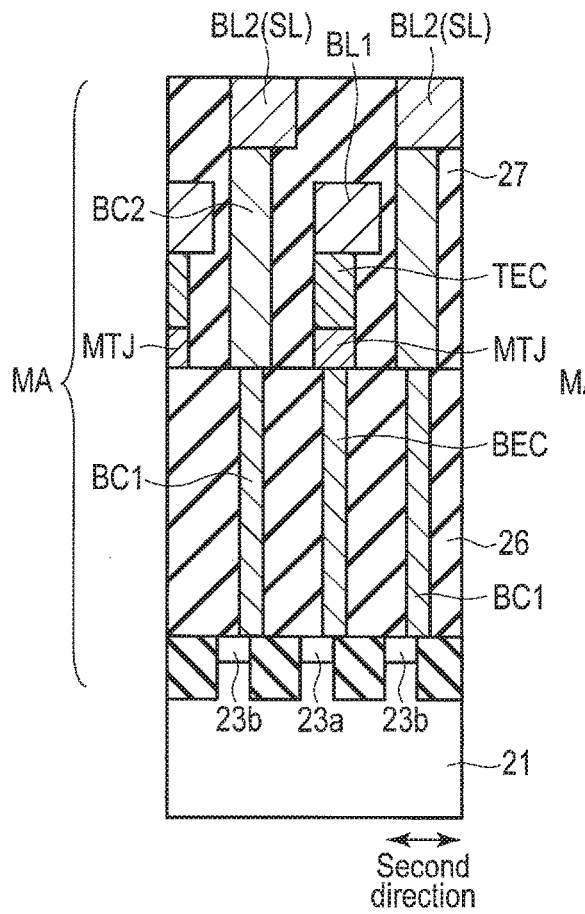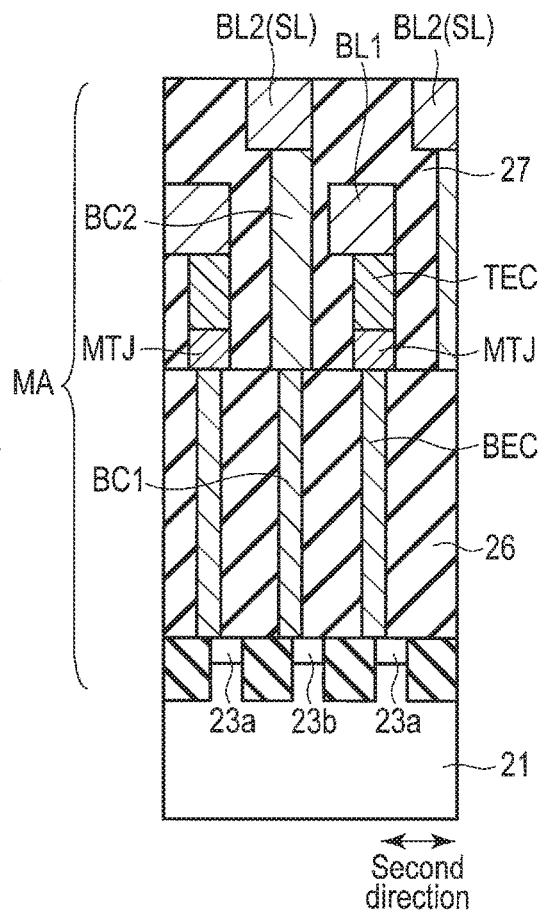
F I G. 16    F I G. 17

US 9,893,121 B2

MAGNETIC MEMORY AND METHOD OF MANUFACTURING MAGNETIC MEMORY

CROSS REFERENCE TO RELATED APPLICATIONS

This application is a Continuation Application of PCT Application No. PCT/JP2014/067300, filed Jun. 24, 2014 and based upon and claiming the benefit of priority from U.S. Provisional Application No. 61/951,414, filed Mar. 11, 2014, the entire contents of all of which are incorporated herein by reference.

FIELD

Embodiments described herein relate generally to a magnetic memory and a method of manufacturing a magnetic memory.

BACKGROUND

In a spin injection writing type of magnetic memory, e.g., a spin-transfer torque magnetic random access memory (STT-MRAM), current necessary for magnetization reversal or a Magnetoresistive element is defined by a current density. That is, this type of magnetic memory has scalability in which the current necessary for magnetization reversal decreases in accordance with reduction of the size of the magnetoresistive element. Furthermore, if it is made to be of a vertical magnetization type in which a magnetization direction of residual magnetization of the magnetoresistive element is perpendicular to a film surface, the current necessary for magnetization reversal can be further decreased. For such a reason, the spin injection writing type of magnetic memory is one of odds-on favorites as a next-generation memory.

However, in order that a spin injection type magnetic memory be put to practical use, it is necessary to solve a problem of the magnetoresistive element with respect to processing. For example, the magnetoresistive element comprises a magnetic layer (storage layer) having variable magnetization, a magnetic layer (reference layer) having invariable magnetization and an insulating layer (tunnel barrier layer) between the above magnetic layers. This is a basic structure of the magnetoresistive element.

BRIEF DESCRIPTION OF THE DRAWINGS

FIG. 11 is a view showing a comparison between an embodiment and comparative examples;

FIG. 16 is a cross-sectional view taken along line XVI-XVI in FIG. 14;

FIG. 17 is a cross-sectional view taken along line XVII-XVII in FIG. 14;

DETAILED DESCRIPTION

In general, according to one embodiment, a magnetic memory comprises: a first metal layer including a first metal; a second metal layer on the first metal layer, the second metal layer including a second metal which is more easily oxidized than the first metal, the second metal layer having a first sidewall portion which contacts the first metal layer, and the second metal layer having a second sidewall portion above the first sidewall portion, the second sidewall portion which steps back from the first sidewall portion; a magnetoresistive element on the second metal layer; a third metal layer on the magnetoresistive element; a first material which contacts a sidewall portion of the magnetoresistive element and the second sidewall portion of the second metal layer, the first material including the second metal; a spacer layer covering the first material; a second material which contacts a sidewall portion of the spacer layer and the first sidewall portion of the second metal layer, the second material including the first metal; and a protection layer covering the first metal layer, the second metal layer, the magnetoresistive element, the third metal layer, the first material, the spacer layer, and the second material.

1. Magnetoresistive Element

An example of a magnetoresistive element serving as a memory cell in a magnetic memory will be explained.

(1) Structure

Figure 1:
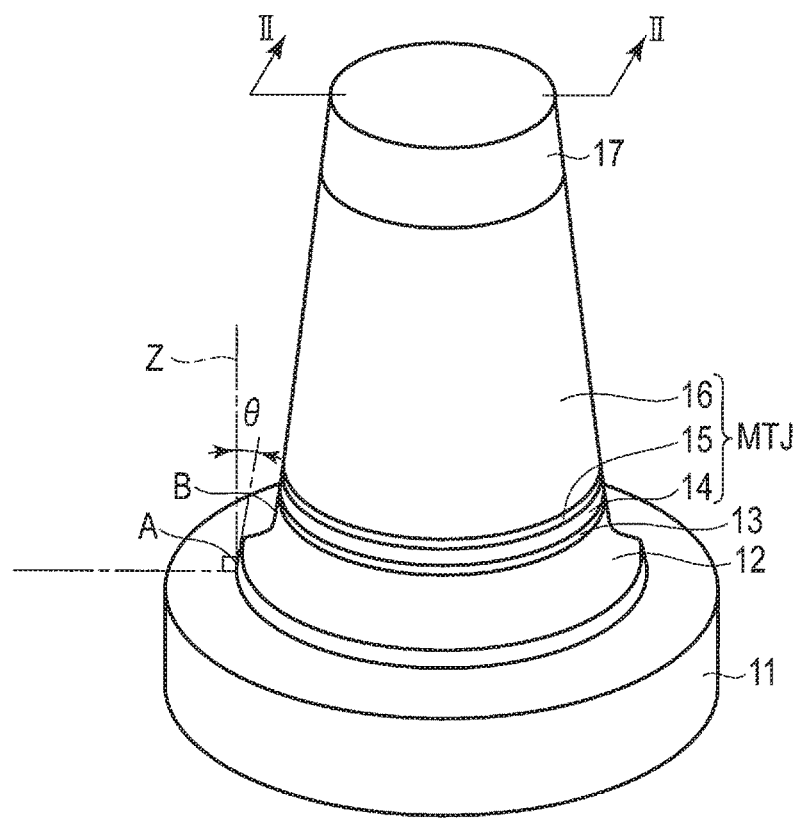
FIG. 1 is a perspective view showing an example of a magnetoresistive element.
Figure 2:
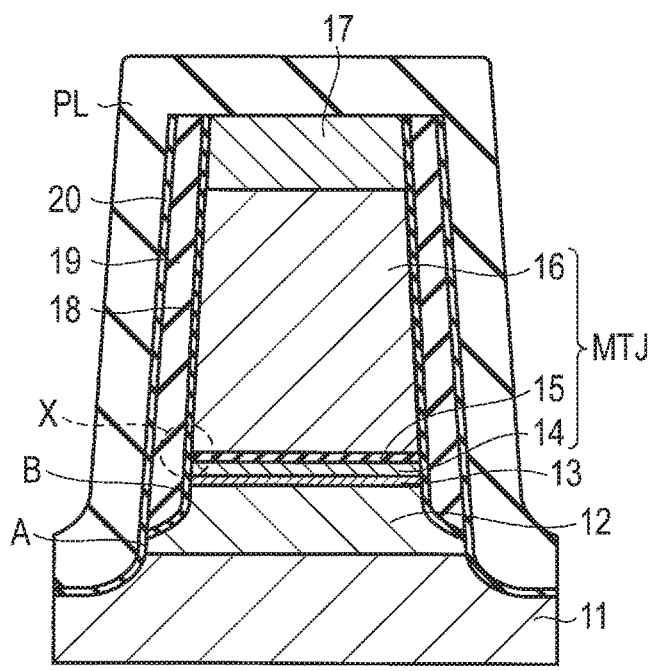
FIG. 2 is a cross-sectional view taken along line II-II in FIG. 1.

FIG. 1 shows the example of the magnetoresistive element. FIG. 2 is a cross-sectional view taken along line II-II in FIG. 1. However, in FIG. 1, in order to clarify a positional relationship between elements denoted by reference numerals 11-17 in FIG. 1, elements denoted by reference numerals 18, 19, 20 and reference sign PL in FIG. 2 are omitted.

To be more specific, first metal layer 11 contains hardly oxidizable metal which is hard to oxidize, such as W, Ta, Ru or Ti. First metal layer 11 may be provided as a compound such as TaN or TiN. Also, first metal layer 11 may be provided as a contact plug, an electrode or an interconnect.

Second metal layer 12 is disposed on first metal layer 11. Also, second metal layer 12 contains easily oxidizable metal which is more easily oxidized than the first metal, such as Al, Be, Mg, Ca, Sr, Ba, Sc, Y, La, Zr or Hf. Second metal layer 12 may be provided as a compound such as HfB, MgAlB, HfAlB, ScAlB, ScHfB or HfMgB. Second metal layer 12 may include a stacked structure thereof.

Whether metal is the hardly oxidizable metal or the easily oxidizable metal can be determined based on, e.g., its standard electrode potential. To be more specific, if second metal layer 12 contains second metal whose standard electrode potential is lower than that of first metal in first metal layer 11, the second metal can be defined as the easily oxidizable metal. On the other hand, if first metal layer 11 contains first metal whose standard electrode potential is higher than that of second metal in second metal layer 12, the first metal can be defined as the hardly oxidizable metal.

Second metal layer 12 includes first sidewall portion A which is in contact with first metal layer 11 and second sidewall portion B which is located inward of first sidewall portion A and in an upper position than first sidewall portion A. Each of first and second sidewall portions A and B is defined as a side surface having an angle of tilt θ of 15° or less.

In such a manner, since second metal layer 12 includes first and second sidewall portions A and B, a base having a lamination structure, which is provided on second metal layer 12, is stabilized. As a result, the lamination structure can be prevented from falling down.

Underlying layer 13 is provided on second metal layer 12. Magnetoresistive element MTJ is provided on underlying layer 13. Underlying layer 13 is provided to crystallize magnetoresistive element MTJ. It is preferable that underlying layer 13 includes MgO or one of compounds of nitride, for example, AlN, MgN, ZrN, NbN, SiN, and AlTiN.

Magnetoresistive element MTJ comprises first magnetic layer 14, nonmagnetic layer (tunnel barrier layer) 15 and second magnetic layer 16, first magnetic layer 14 being located on underlying layer 13, nonmagnetic layer 15 being located on first magnetic layer 14, second magnetic layer 16 being located on nonmagnetic layer 15. One of first magnetic layer 14 and second magnetic layer 16 is a reference layer having invariable magnetization, and the other is a storage layer having variable magnetization.

It should be noted that the invariable magnetization means that the direction of magnetization does not vary prior to or subsequent to writing, and variable magnetization means that the direction of magnetization can oppositely vary prior to and subsequent to writing.

Furthermore, the writing means spin transfer writing in which spin injection. current (spin-polarized electrons) are made to flow through magnetoresistive element MTJ, thereby giving a spin torque to magnetization of a storage layer.

Figure 3A:
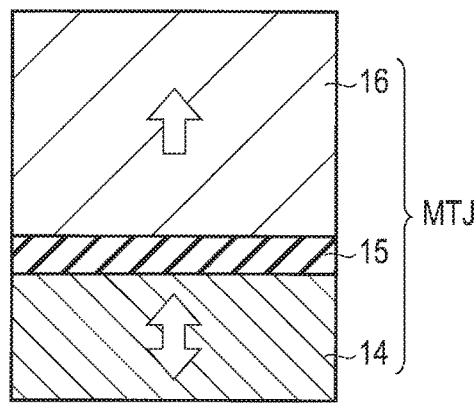
FIGS. 3A and 3B are cross-sectional views showing top-pin types of magnetoresistive element.
Figure 3B:
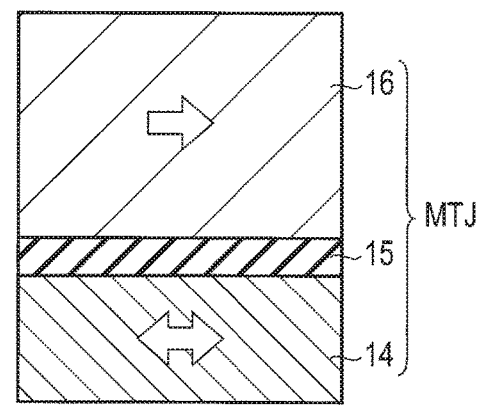
Figure 4A:
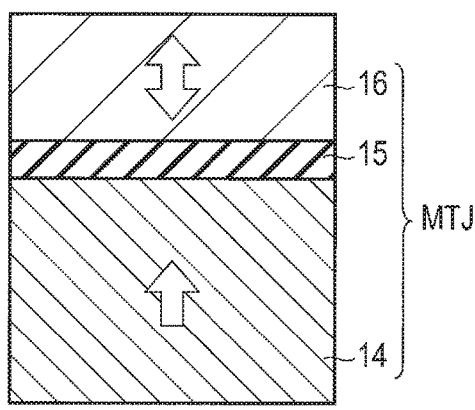
FIGS. 4A and 4B are cross-sectional views showing bottom-pin types of magnetoresistive element.
Figure 4B:
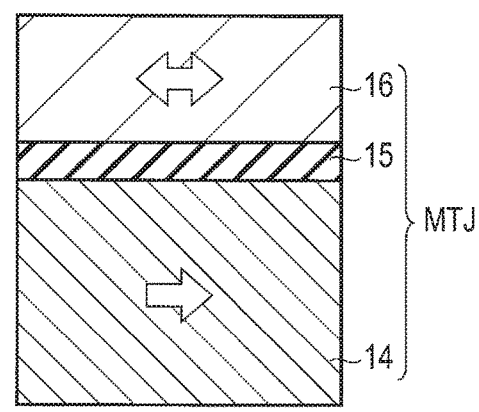

In the case where magnetoresistive element MTJ comprises first magnetic layer 14 serving as a storage layer and second magnetic layer 16 serving as a reference layer, it is referred to as a top-pin type of magnetoresistive element MTJ. FIGS. 3A and 3B show magnetized states of top-pin types of magnetoresistive element MTJ. On the other hand, in the case where magnetoresistive element MTJ comprises first magnetic layer 14 serving as a reference layer and second magnetic layer 16 serving as a storage layer, it is referred to as a bottom-pin type of magnetoresistive element MTJ. FIGS. 4A and 4B show magnetized states of bottom-pin type of magnetoresistive elements MTJ.

It is preferable that first and second magnetic layers 14 and 16 have vertical magnetization, i.e. residual magnetization in a vertical direction in which first and second magnetic layers 14 and 16 are stacked together. FIGS. 3A and 4A show magnetized states of magnetoresistive elements MTJ having vertical magnetization. However, first and second magnetic layers 14 and 16 may have in-plane magnetization, i.e., residual magnetization in a direction perpendicular to the direction in which first and second magnetic layers 14 and 16 are stacked. FIGS. 3B and 4B show magnetized states of magnetoresistive elements MTJ having in-plane magnetization.

A resistance of magnetoresistive element MTJ depends on the directions of magnetization of the storage layer and the reference layer with respect to each other due to a magnetic resistance effect. For example, the resistance of magnetoresistive element MTJ is low, if the storage layer and the reference layer are in a parallel state in which the directions of magnetization of the storage layer and the reference layer are the same as each other, and the resistance of magnetoresistive element MTJ is high, if the storage layer and the reference layer are in an anti-parallel state in which the directions of magnetization of the storage layer and the reference layer are opposite to each other.

First and second magnetic layers 14 and 16 comprise, e.g., CoFeB, MgFeO, or a lamination of CoFeB and MgFeO. If the magnetoresistive element has vertical magnetization, it is preferable that first and second magnetic layers 14 and 16 have TbCoFe having vertical magnetic anisotropy, an artificial lattice in which Co and Pt are stacked together and which has vertical magnetic anisotropy, FePt which is regularized to $L1_o$ and has vertical magnetic anisotropy, etc. In this case, between first magnetic layer 14 and nonmagnetic layer 15 or between nonmagnetic layer 15 and second magnetic layer 16, CoFeB may be provided as an interface layer.

Nonmagnetic layer 15 comprises, e.g., MgO or AlO. Also, nonmagnetic layer 15 may be provided as a nitride which is, e.g., Al, Si, Be, Mg, Ca, Sr, Ba, Sc, Y, La, Zr or Hf.

Third metal layer 17 is provided on magnetoresistive element MTJ. Also, third metal layer 17 contains, e.g., W, Ta, Ru, Ti, TaN or TiN.

Furthermore, third metal layer 17 functions as an electrode, and in addition functions as a mask when magnetoresistive element MTJ is patterned. That is, it is preferable that third metal layer 17 is formed of material, e.g., a lamination of Ta and Ru, which has a low electric resistance and also satisfactory diffusion, etching and milling tolerances.

First re-deposition layer 18 is in contact with a sidewall portion of magnetoresistive element MTJ and second sidewall portion B of second metal layer 12. First re-deposition layer 18 is insulated. to prevent an electrical short failure in first and second magnetic layers 14 and 16. For example, first re-deposition layer 18 comprises an oxide of easily oxidizable metal in second metal layer 12.

Spacer layer 19 covers first re-deposition layer 18. Also, spacer layer 19 comprises an insulating layer such as oxide or nitride.

Second re-deposition layer 20 is in contact with a sidewall portion of spacer layer 19 and first sidewall portion A of second metal layer 12. Also, second re-deposition layer 20 comprises hardly oxidizable metal in first metal layer 11. Second re-deposition layer 20 may comprise an oxide in hardly oxidizable metal in first metal layer 11.

In a direction parallel to an upper surface of first metal layer 11, first and second re-deposition layers 18 and 20 each have a thickness of 1 nm or less. This is because first and second re-deposition layers 18 and 20 are re-deposition layers formed of metal in first and second metal layers 11 and 12 which were vaporized once by etching.

In the direction parallel to the upper surface of first metal layer 11, a distance from first sidewall portion A to second sidewall portion B is substantially equal to a width of spacer layer 19. This is because upper part (second sidewall portion B) of second metal layer 12 is etched, with third metal layer 17 used as a mask, and lower part (first sidewall portion A) of second metal layer 12 is etched, with third metal layer 17 and spacer layer 19 used as a mask.

The embodiment is effective in the case where in the direction parallel to the upper surface of first metal layer 11, magnetoresistive element MTJ is smaller in size than first metal layer 11. This is because in the above case, when magnetoresistive element MTJ is patterned by performing etching only once, the upper surface of first metal layer 11 is exposed and a re-deposition layer of hardly oxidizable metal is formed.

In such a manner, according to the embodiment, in the direction parallel to the upper surface of first metal layer 11, widths of first and second magnetic layers 14 and 16 as measured from portion X, i.e., widths of portions of first and second magnetic layers 14 and 16, which are in contact with nonmagnetic layer 15, are substantially equal to each other. Thus, variance in MR ratio between magnetoresistive elements MTJ can be reduced, as compared with the case where the widths of first and second magnetic layers 14 and 16 as measured from portion X, i.e., the widths of the portions of the first and second magnetic layers 14 and 16, which are in contact with nonmagnetic layer 15, are different from each other. Furthermore, first re-deposition layer 18, which contacts a sidewall portion of nonmagnetic layer 15, contains easily oxidizable metal in second metal layer 12. Thus, first re-deposition layer 18 is easily insulated by oxidizing the easily oxidizable metal. That is, an electrical short failure of first and second magnetic layers 14 and 16 are effectively prevented. In addition, second re-deposition layer 20, which contains hardly oxidizable metal in first metal layer 11, contacts spacer layer 19, and thus an electrical short failure of first and second magnetic layers 14 and 16 does not occur due to the hardly oxidizable metal or insufficiency of oxidation of the hardly oxidizable metal.

Therefore, in the structure of the embodiment, an electrical short failure is prevented from occurring in a magnetoresistive element is prevented, and variance in MR ratio between. magnetoresistive elements is reduced. As a result, a magnetic memory having high reliability can be achieved.

2. Method of Manufacturing Magnetic Memory

A method of manufacturing a magnetic memory comprising magnetoresistive elements each shown in FIGS. 1 and 2 will be explained.

Figure 5:
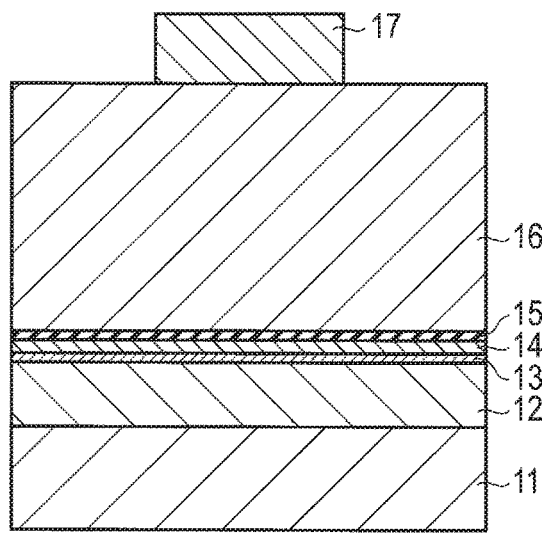
FIGS. 5-10 are cross-sectional views showing an example of as manufacturing method of magnetoresistive elements.

First of all, as shown in FIG. 5, first metal layer 11, second metal layer 12, underlying layer 13, first magnetic layer 14, nonmagnetic layer 15 and second magnetic layer 16 are stacked together by, for example, chemical vapor deposition (CVD). Then, third metal layer 17 serving as a hard mask layer is formed on second magnetic layer 16 by CVD and photo engraving process (PEP).

Figure 6:
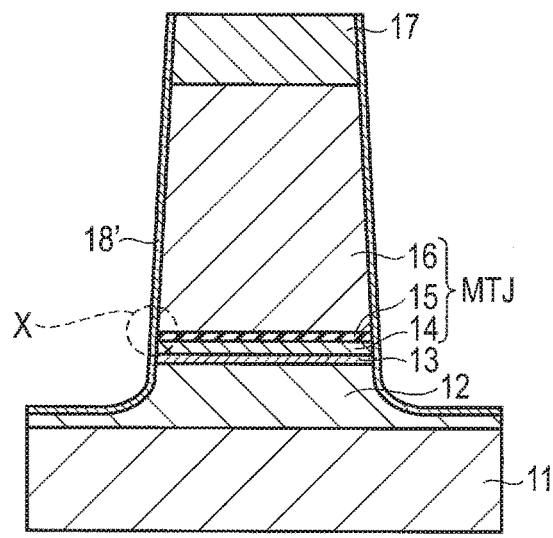

Next, as shown in FIG. 6, a first etching process will be executed.

The first etching process is carried out by a performing physical etching such as an ion beam etching (IBE) and reactive etching such as a reactive ion etching (RIE). In the case where the IBE is applied to the first etching process, for example, Ne, Ar, Kr, Xe, N or O is used as an element of an ion beam for use in the IBE.

The first etching process is intended to etch magnetoresistive element MTJ, underlying layer 13 and second metal layer 12, with third metal layer 17 used as a mask.

In this case, since magnetoresistive element MTJ is patterned by only one etching, its shape can be made closer to an ideal shape. That is, a tilt of a sidewall portion of magnetoresistive element MTJ can be set to 15° or less. Furthermore, in the direction parallel to the upper surface of first metal layer 11, widths of first and second magnetic layers 14 and 16 as measured from portion X, i.e., the widths of the portions of first and second magnetic layers 14 and 16, which contact nonmagnetic layer 15, can be made substantially equal to each other. Thus, the variance in MR ratio between magnetoresistive elements MTJ can be reduced.

Furthermore, the first etching process is stopped when an intermediate part of second metal layer 12 appears for the following reason:

In the first etching process, magnetoresistive element MTJ is patterned while removing first re-deposition layer 18' adhering to the sidewall portion. during etching by controlling, e.g., an incident angle, energy, etc. of the ion beam.

However, in the first etching process, it is hard to completely remove a re-deposition object of a metal layer to be etched last.

Thus, in the case where the metal layer to be etched last is first metal layer 11 containing hardly oxidizable metal, the hardly oxidizable metal in first metal layer re-adheres to the sidewall portion of magnetoresistive element MTJ, and finally, first re-deposition layer 18' is formed.

It is hard to completely insulate first re-deposition layer 18' containing the hardly oxidizable metal by oxidation. Thus, an electrical short failure occurs in first and second magnetic layers 14 and 16.

In view of the above, in the embodiment, the metal to be etched last is second metal layer 12 containing easily oxidizable metal. To be mores specific, as described above, the first etching process is stopped when it reaches the intermediate part of second metal layer 12. In this case, easily oxidizable metal in second metal layer 12 re-adheres to the sidewall portion of magnetoresistive element MTJ, and finally, first re-deposition layer 18' containing easily oxidizable metal is thus formed.

First re-deposition layer 18' containing easily oxidizable metal can be completely insulated by oxidation. Therefore, it is possible to prevent an electrical short failure of first and second magnetic layers 14 and 16.

Second metal layer 12 is made to have second wide wall B by executing the first etching process. That is, first re-deposition layer 18' containing easily oxidizable metal in second metal layer 12 contacts the sidewall portion of magnetoresistive element MTJ and second sidewall portion B of second metal layer 12. The tilt of second sidewall portion B is 15° or less with respect to an axis perpendicular to the upper surface of first metal layer 11.

Figure 7:
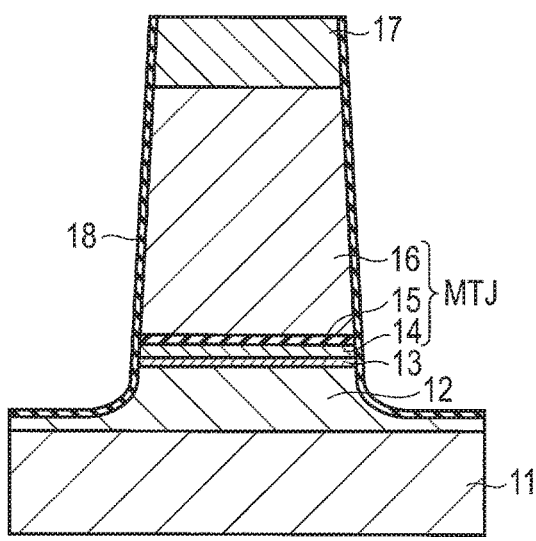

Thereafter, due to oxidation (e.g., thermal oxidation), first re-deposition layer 18' is converted into an oxide of easily oxidizable metal. As a result, as shown in FIG. 7, first re-deposition layer 18 containing the oxide of easily oxidizable metal is formed on the side surface of magnetoresistive element MTJ.

Figure 8:
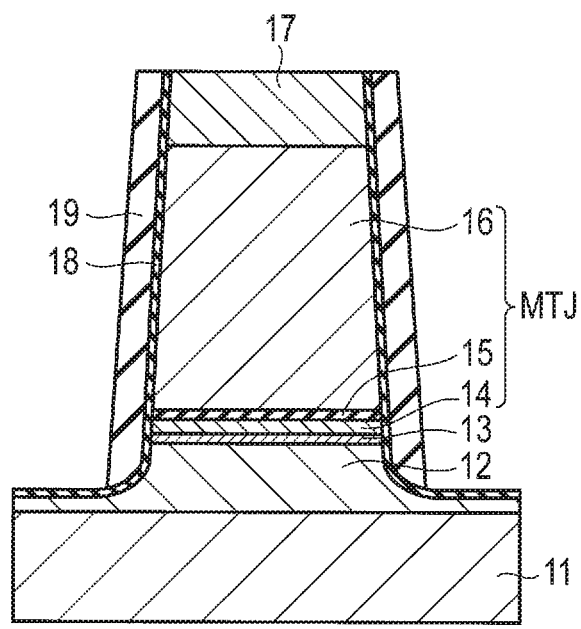

Next, as shown in FIG. 8, by the CVD and the RIE, spacer layer 19 is formed to cover first re-deposition layer 18. Spacer layer 19 comprises silicon oxide, silicon nitride or the like.

Since spacer layer 19 functions as a mask layer, in the direction parallel to the upper surface of first metal layer 11, spacer layer 19 has a greater width than a width (e.g., 1 nm) of at least first re-deposition layer 18. For example, it is preferable that in the direction parallel to the upper surface of first metal layer 11, spacer layer 19 have a with greater than 1 nm and smaller than 10 nm.

Figure 9:
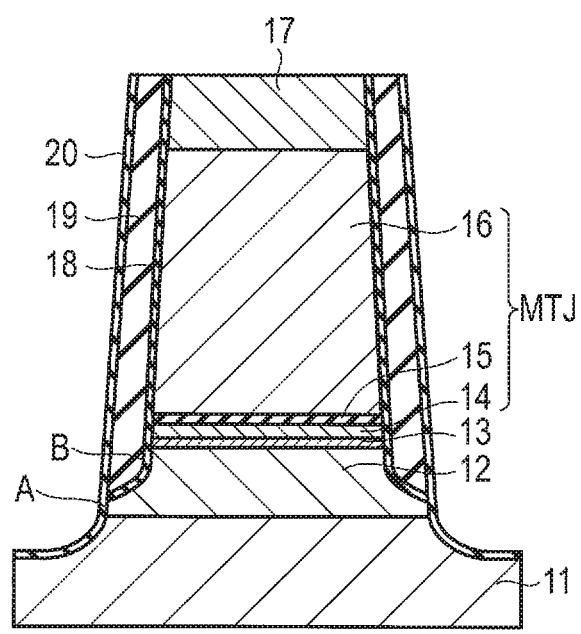

Next, as shown in FIG. 9, a second etching process is executed.

The second etching process is carried out by performing physical etching such as the IBE or a reactive etching such as the RIE, as well as the first etching process. In the case where the IRE is applied to the second etching process, for example, Ne, Ar, Kr, Xe, N or O is used as an element of an ion beam for use in the IBE.

The second etching process is intended to etch first re-deposition layer 18 and second metal layer 12, with third metal layer 17 and spacer layer 19 used as a mask.

The second etching process is stopped when the upper surface of first metal layer 11 appears. That is, the second etching process is executed until etching of second metal layer 12 is completely ended, i.e., the upper surface of first metal layer 11 is exposed.

This is because a magnetic memory comprises an array of magnetoresistive elements. That is, when first re-deposition layer 18 and second metal layer 12 are etched, the magnetoresistive elements in the magnetic memory can be electrically disconnected from each other.

When the second etching process is executed, second metal layer 12 is made to have first sidewall portion A. First sidewall portion A contacts first metal layer 11. Second sidewall portion B is located in such a manner as to recede from first sidewall portion A. The tilt of first sidewall portion A is 15° or less with respect to the axis perpendicular to the upper surface of first metal layer 11.

In the second etching process, since second metal layer 12 is completely etched, the metal layer to be etched last is first metal layer 11. Thus, second re-deposition layer 20 containing hardly oxidizable metal in first metal layer 11 contacts a sidewall portion of spacer layer 19 and first sidewall portion A of second metal layer 12.

However, since second re-deposition layer 20 does not contact the sidewall portion of nonmagnetic layer 15 of magnetoresistive element MTJ, an electrical short failure does not occur in first and second magnetic layers 14 and 16.

Figure 10:
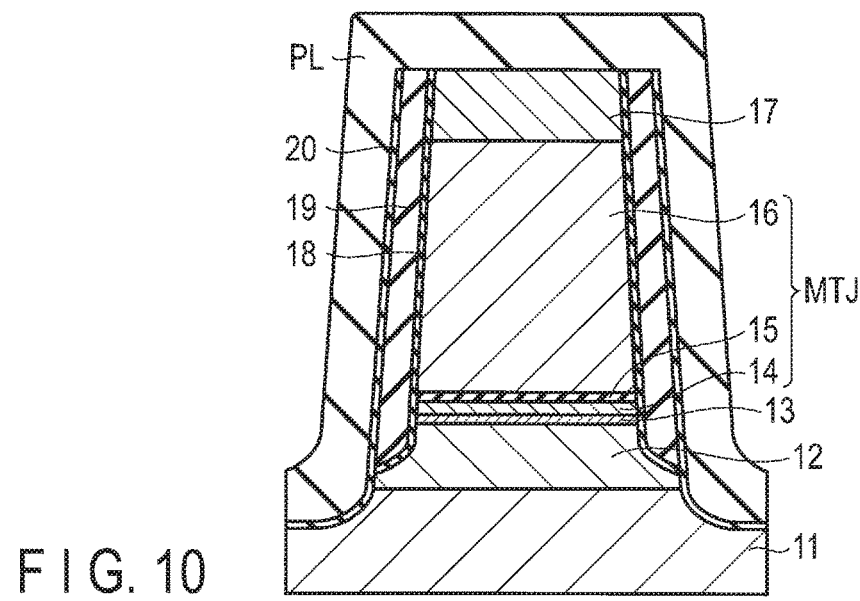

Finally, as shown in FIG. 10, by the CVD, protection layer PL is formed to cover first metal layer 11, second metal layer 12, magnetoresistive element MTJ, third metal layer 17, first re-deposition layer 18, spacer layer 19 and second re-deposition layer 20.

By the above manufacturing method, a magnetic memory comprising magnetoresistive elements each shown in FIGS. 1 and 2 is completely formed. Thereafter, for example, a wafer including the magnetic memory is exposed to the atmosphere.

Protection layer PL as shown in FIG. 10 is provided to prevent magnetoresistive element MTL subjected to the above processes from being oxidized by oxygen in the atmosphere. Thus, it is preferable that protection layer PL comprise a layer having a characteristic of shutting out oxygen, for example, a layer formed of nitride such as SiN, AlN or HfN. Also, it is preferable t in the direction parallel to the upper surface of first metal layer 11, protection layer PL have a width of 10 nm or more.

3. Present Embodiment and Comparative Example

FIG. 11 is a view showing comparisons between the embodiment and comparative examples.

In the figure, elements corresponding to those in FIGS. 1 and 2 are denoted by the same numerals and signs.

In the embodiment, the first etching process is stopped when an intermediate portion of second metal layer 12 containing easily oxidizable metal appears, and the second etching process is executed, with third metal layer 17 and spacer layer 19 used as a mask. Such a process is referred to as a semi-sidewall process.

In this case, as described above, it is possible to achieve prevention of an electrical short failure of magnetoresistive element MTJ and improvement of the MR ratio thereof at the same time.

By contrast, in comparative example No. 1, etching of magnetoresistive element MTJ is performed in a single etching process. Thus, although magnetoresistive element MTJ can he patterned to have an ideal shape, re-deposition layer 20 containing hardly oxidizable metal in first metal layer 11 is formed on a sidewall portion of nonmagnetic layer 15.

Thus, in comparative example No. 1, oxidation of re-deposition layer 20 is insufficient, and as a result there is a case where an electrical short failure occurs in magnetoresistive element MTJ. On the other hand, if re-deposition layer 20 is sufficiently oxidized for a long time in order that it become a complete oxide, first and second magnetic layers 14 and 16 of magnetoresistive element MTJ are oxidized to lower the MR ratio.

In comparative example No. 2, the first etching process is stopped when an upper surface of nonmagnetic layer (tunnel barrier layer) 15 appears, and the second etching process is performed, with third metal layer 17 and spacer layer 19 used as a mask. Such a Process is referred to as a stop-on-tunnel-barrier process.

In this case, an electrical short failure of magnetoresistive element MTJ can be prevented as in the embodiment. However, in the direction. parallel to the upper surface of first metal layer 11, the width of first magnetic layer 14 is greater than that of any part of second magnetic layer 16. That is, portions of first. and second magnetic layers 14 and 16, which contact nonmagnetic layer 15, have different widths. As a result, MR ratios vary.

Also, in comparative example No. 2, after the first etching process, first magnetic layer 14 can also be partially inactivated by ion implantation. However, in this case, due to addition of an ion implantation process, a manufacturing cost is increased.

In the embodiment, a magnetoresistive element having an ideal shape can be formed without deteriorating its characteristics. In this regard, the embodiment is superior to comparative examples No. 1 and No. 2.

4. Application Example

Figure 12:
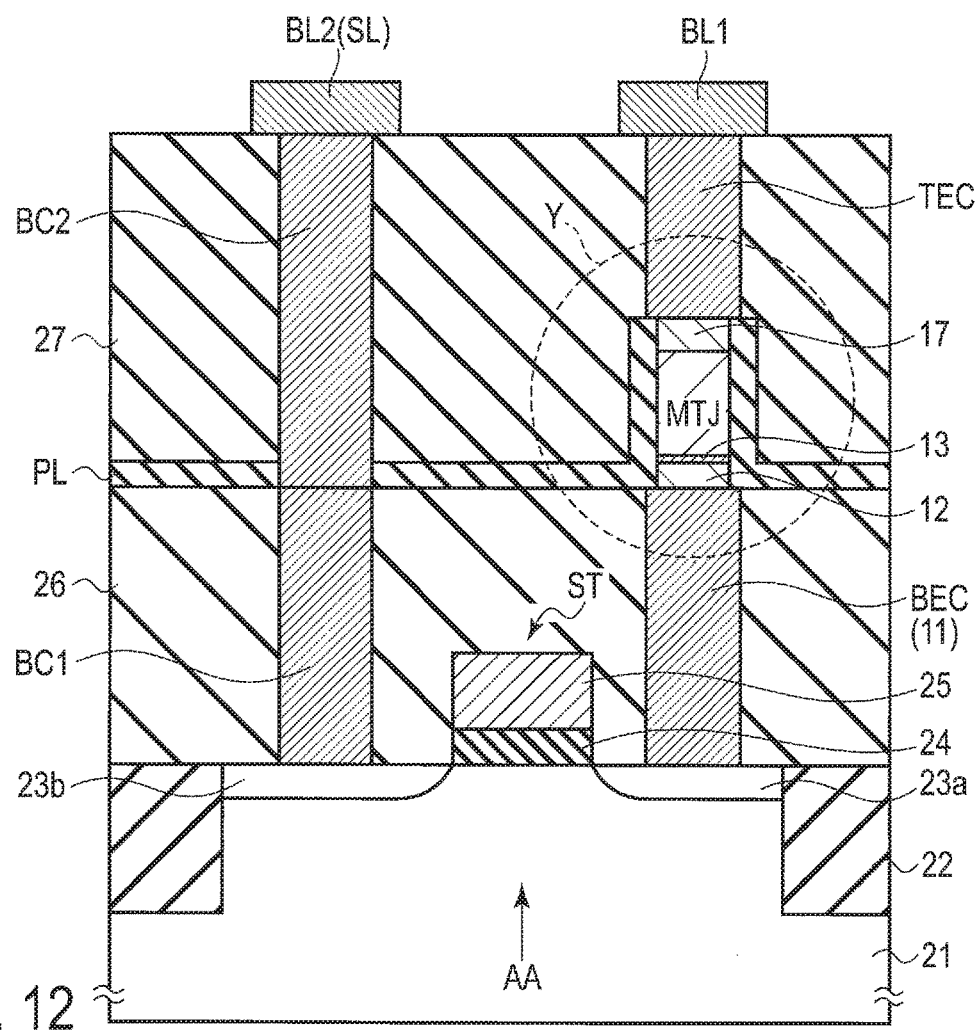
FIG. 12 is a cross-sectional view showing a memory cell as an example of application thereof.

FIG. 12 shows an example of a memory cell in a magnetic memory.

In the example, the memory cell in the magnetic memory comprises a select transistor (e.g., FET) ST and magnetoresistive element MTJ, which corresponds to magnetoresistive element MTJ in the above embodiment.

The select transistor ST is disposed in an active area AA in semiconductor substrate 21. Active area AA is surrounded by an element isolation insulating layer 22 in semiconductor substrate 21. In the example, element isolation insulating layer 22 has a shallow trench isolation (STI) structure.

Select transistor ST comprises source/drain diffusion layers 23a and 23b in semiconductor substrate 21, gate insulating layer 24 on a channel between the diffusion layers and gate electrode 25 on gate insulating layer 24. Gate electrode 25 functions as a word line.

Interlayer insulating layer (e.g., silicon oxide layer) 26 covers select transistor ST. Contact plugs BEC and BC1 are disposed in interlayer insulating layer 26. Also, contact plugs BEC and BC1 correspond to first metal layer 11 containing hardly oxidizable metal, e.g., one of W, Ta, Ru and Ti.

An upper surface of interlayer insulating layer 26 is flat, and second metal layer 12 is disposed on first metal layer 11. Second metal layer 12 contains easily oxidizable metal, e.g., one of Al, Be, Mg, Ca, Sr, Ba, Sc, Y, La, Zr and Hf. Also, second metal layer 12 is connected to source/drain diffusion layer 2 of select transistor ST by first metal layer 11 serving as contact plug BEC.

Magnetoresistive element MTJ is disposed on underlying layer 13 on second metal layer 12. Further, third metal layer 17 is disposed on magnetoresistive element MTJ. Third metal layer 17 functions as, e.g., a hard mask layer for use in processing magnetoresistive element MTJ.

Protection layer (e.g., silicon nitride layer) PL covers a sidewall portion of magnetoresistive element MTJ.

Interlayer insulating (e.g., silicon oxide layer) 27 is disposed on protection layer PL and covers magnetoresistive element MTJ. An upper surface of interlayer insulating layer 27 is flat, and bit lines BL1 and BL2 are disposed on interlayer insulating layer 27. Bit line BL1 is connected to third metal layer 17 by contact plug TEC. Bit line BL2 is connected to contact plug BC1 by contact plug BC2.

In the example, in the direction parallel to the surface of semiconductor substrate 21, magnetoresistive element MTJ has a smaller size than that of contact plug BEC.

Figure 13A:
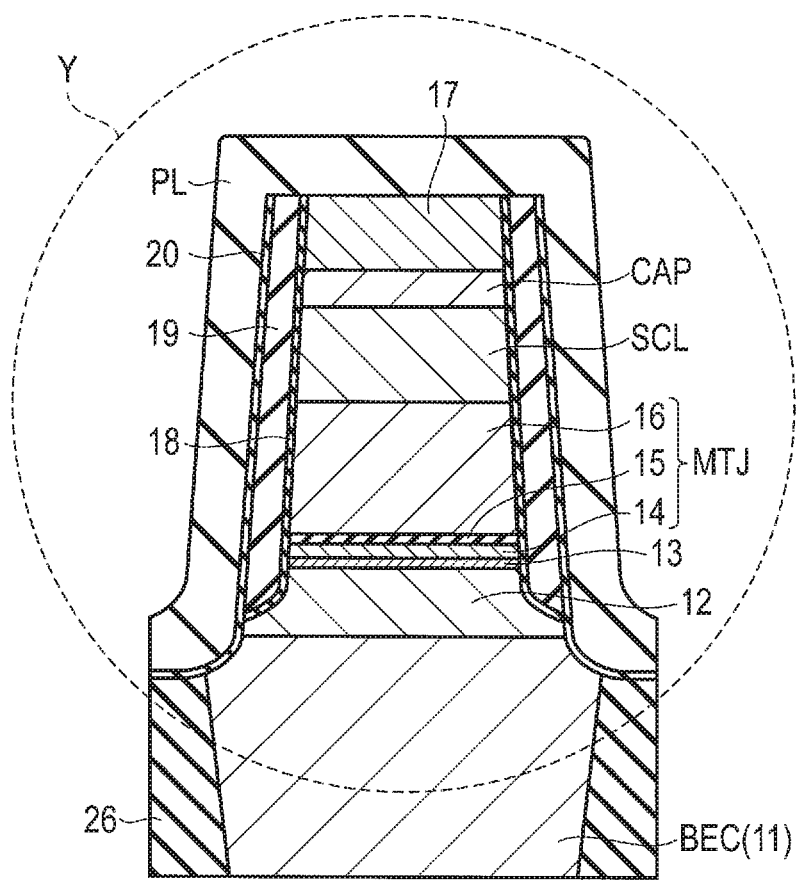
FIGS. 13A and 13B are cross-sectional views showing examples of a magnetoresistive element as shown in FIG. 12.
Figure 13B:
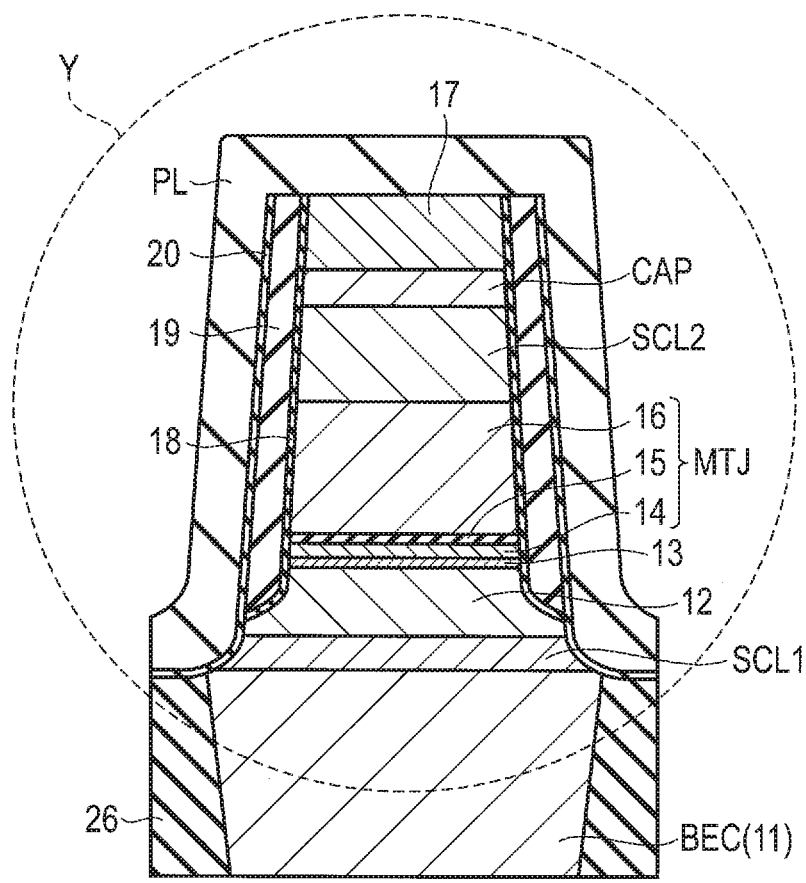

FIGS. 13A and 13B show examples of magnetoresistive element MTJ as shown in FIG. 12.

A structure as shown in FIG. 13A is different from the structure as shown in FIGS. 1 and 2 as follows: first magnetic layer 14 is a storage layer, second magnetic layer 16 is a reference layer, and shift cancelling layer SCL and cap layer CAP are newly added.

A structure as shown in FIG. 13B is different from the structure as shown in FIGS. 1 and 2 as follows: first magnetic layer 14 is a storage layer, second magnetic layer 16 is a reference layer, and shift cancelling layers SCL1 and SCL2 and cap layer CAP are newly added.

The structure as shown in FIG. 13B is a bottom shift cancelling structure in which shift cancelling layer SCL1 is located just below first magnetic layer 14 serving as the storage layer. In this case, shift cancelling layer SCL2 just on second magnetic layer 16 serving as the reference layer may be omitted.

Shift cancelling layer SCL as shown in FIG. 13A and shift cancelling layers SCL1 and SCL2 as shown in FIG. 13B each have a structure in which n layers each comprising a Co layer and a Pt layer are stacked together, and which is expressed by [Co/Pt]n.

On the other points, the structures as shown. in FIGS. 13A and 13B are the same as that as shown in FIGS. 1 and 2. For example, a material using for forming first, second, and third metal layers 11, 12, 17, underlying layer 13, and magnetoresistive element MTJ is as described with FIGS. 1 and 2. Thus, in the structures as shown in FIGS. 13A and 13B, elements identical to those of the structure as shown in FIGS. 1 and 2 will be denoted by the same reference numerals and sign as in the structure as shown in FIGS. 1 and 2 and their detailed explanations will be omitted.

Referring to FIGS. 13A and 13B, shift cancelling layers SCL, SCL1 and SCL2 have invariable and vertical magnetization. The direction of magnetization of shift cancelling layers SCL, SCL1 and SCL2 is opposite to that of reference layer 15. Thus, shift cancelling layers SCL, SCL1 and SCL2 cancel a shift (variation) of a magnetization reversal characteristic (hysteresis curve) of first magnetic layer (storage layer) 14 which occurs due to a stray magnetic field from second magnetic layer (reference layer) 16.

Cap layer CAP is disposed between shift cancelling layer SCL and upper electrode 17 or between shift cancelling layer SCL2 and upper electrode 17. Cap layer CAP functions as a buffer layer which prevents reaction between shift canoe on layer SCL and upper electrode 17 or between shift cancelling layer SCL2 and upper electrode 17. Cap layer CAP comprises, e.g., Pt, W, Ta or Ru.

It should be noted that in the structures as shown in FIGS. 13A and 13B, second re-deposition layer 20 is also formed on interlayer insulating 26 and contact plug BEC.

Second re-deposition layer 20 has a very small thickness (≤1 nm). It is not a continuous layer filled with elements; i.e., it partially comprises elements. However, in the figures, second re-deposition layer 20 is shown as a single continuous layer in order that the explanation be easily understood.

Thus, second re-deposition layer 20 becomes a cause of an electrical short failure in a very thin layer like nonmagnetic layer 15; however, it does not cause an electrical short failure in two magnetoresistive elements sufficiently separated from each other.

However, in order to reliably prevent such a failure, second re-deposition layer 20 may be converted into an oxide of hardly oxidizable metal.

Figure 14:
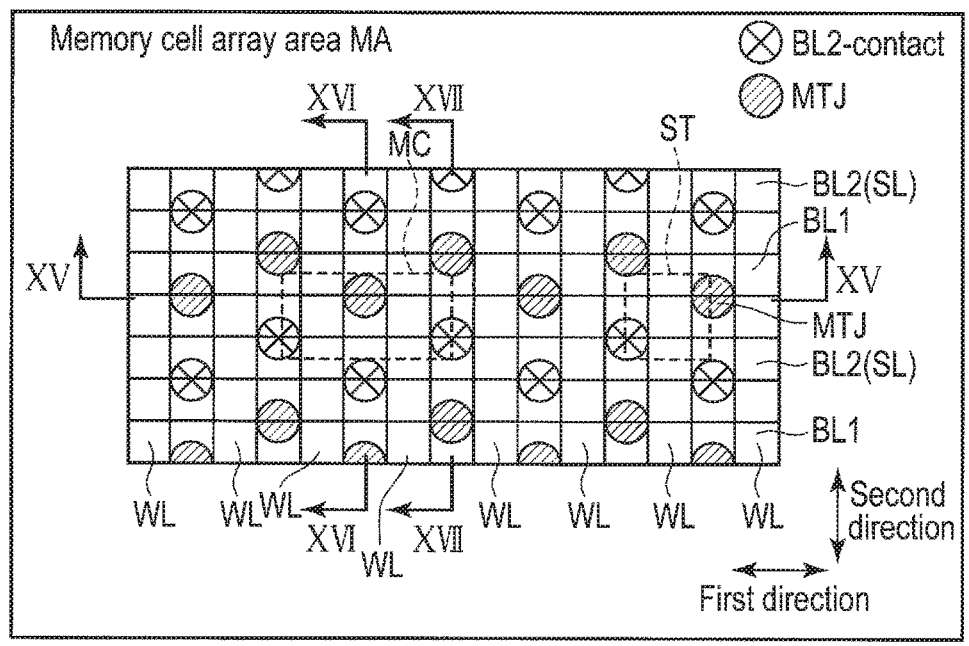
FIG. 14 is a plan view showing an example of a memory cell array.
Figure 15:
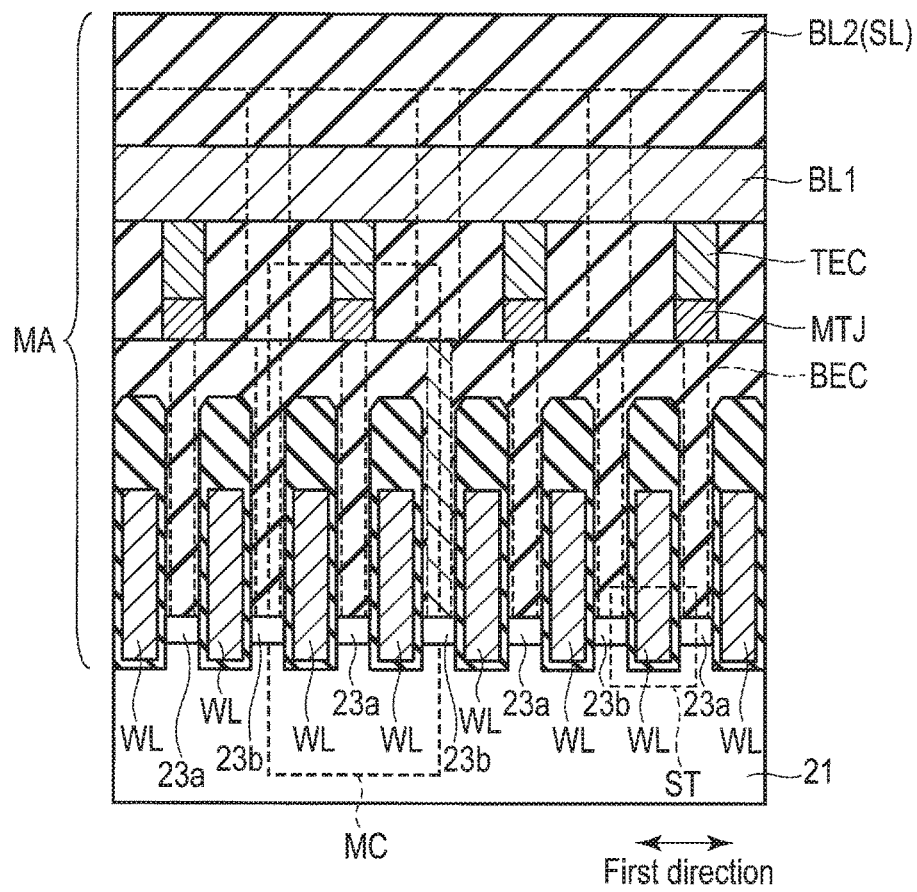
FIG. 15 is a cross-sectional view taken along line XV-XV in FIG. 14.
Figure 18:
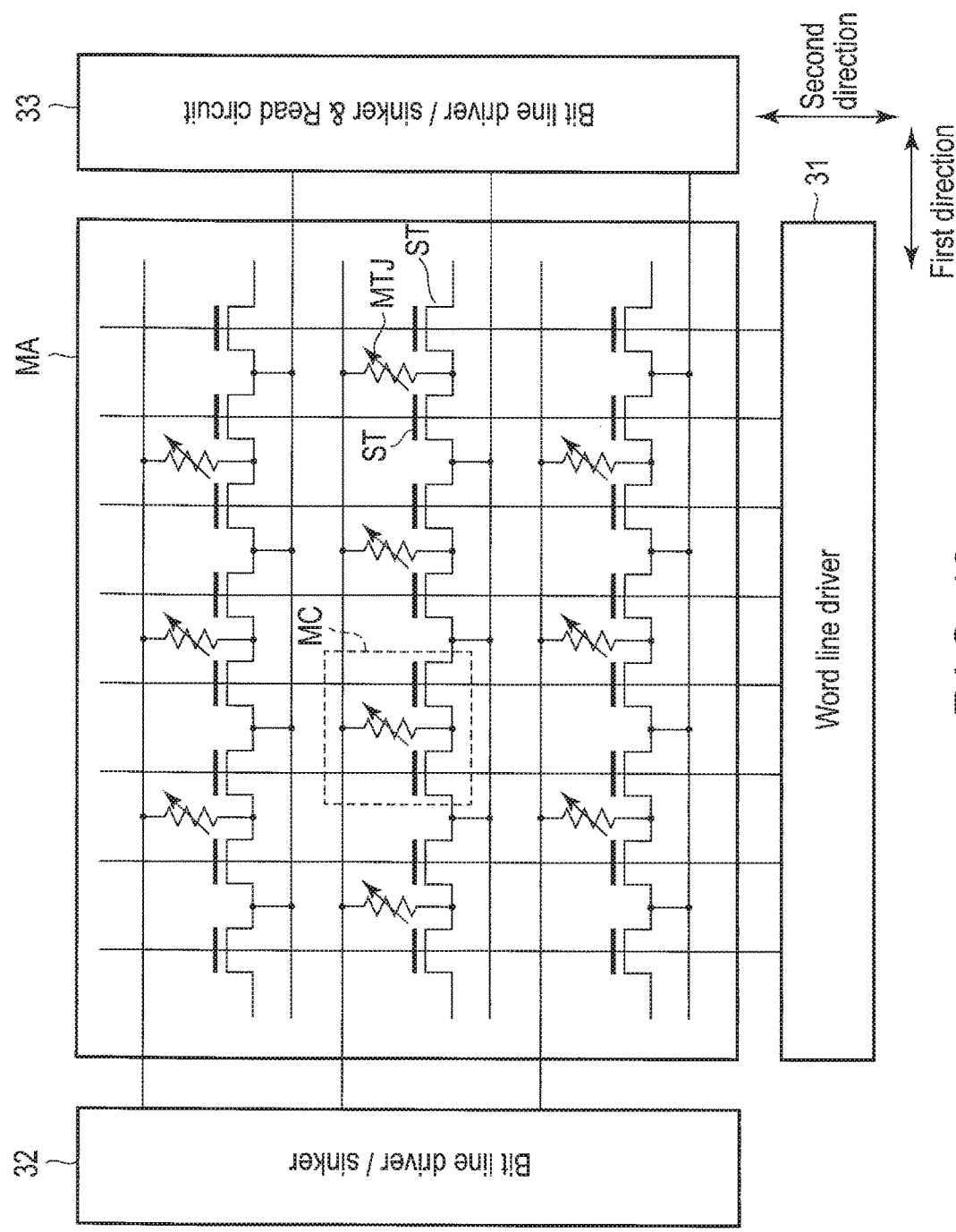
FIG. 18 is a circuit diagram showing an equivalent circuit of a memory cell array as shown in FIGS. 14-17.

FIGS. 14-18 show an example of a memory cell array area of a magnetic random access memory. FIG. 14 is a plan view of the memory cell array area, FIG. 15 is a cross-sectional view taken along line XV-XV in FIG. 14, and FIG. 16 is a cross-sectional view taken along line XVI-XVI in FIG. 14, and FIG. 17 is a cross-sectional view taken along line XVII-XVII in FIG. 14. FIG. 18 shows an equivalent circuit in the memory cell array area.

In FIGS. 14-18, elements identical to those in FIGS. 12 and 13 are denoted by the same signs as therein.

The example will be explained with respect to a so-called 2-transistor 1-element type of memory cell area MA in which each of memory cells MC comprises two select transistors ST and one magnetoresistive element MTJ. This, however, does not mean that the embodiment is limited to such a type. That is, the embodiment can be applied to other types of memory cell array areas MA, e.g., a 1-transistor 1-element type of memory cell area MA and a cross-point type of memory cell array area MA.

On semiconductor substrate 21, a plurality of memory cells MC are arranged in array. Each memory cell MC comprises two select transistors ST on semiconductor substrate 21 and one magnetoresistive element MTJ connected to in common to these two select transistors ST.

Each of the select transistors ST comprises source/drain diffusion layers 23a and 23b in semiconductor substrate 21 and word line WL serving as a gate electrode on a channel between source/drain diffusion layers 23a and 23b. Word line WL extends in a second direction, and is connected to word-line driver 31.

Magnetoresistive element MTJ is disposed above source/drain diffusion layer 23a, and connected thereto. Bit line BL1 is disposed above magnetoresistive element MTJ and connected thereto. Also, bit line BL1 extends in a first direction, and is connected to bit line driver/sinker 32.

Bit line BL2 is disposed above source/drain diffusion layer 23b, and connected thereto. At the time of performing a reading operation, bit line BL2 also functions as, e.g., source line SL which is connected to a sense amplifier. Also, bit line BL2 extends in the first direction, and is connected to bit line driver/sinker & reading circuit 33.

The layout of the memory cell array of the example is an example, and can be modified as appropriate. For example, in the example, as the memory cell array area MA is viewed from a side located above semiconductor substrate 21, source/drain diffusion layers 23a and 23b, magnetoresistive element MTJ and bit line BL1 shift relative to each other in the second direction. However, whether or not they shift relative to each other, the amount of shifting of them, etc. can be changed as appropriate.

In addition, in the example, bit lines BL1 and BL2 are formed in different interconnect layers; however, they may be formed in a single interconnect layer.

5. Manufacturing Equipment

In the above manufacturing method, it is preferable that a process (e.g., CVD) of forming a lamination structure including the magnetoresistive element, the first and second etching processes (e.g., the IBE) and a process (e.g., thermal oxidation) of oxidizing the first re-deposition layer are carried out such that they are not in outside air (oxygen).

Figure 19:
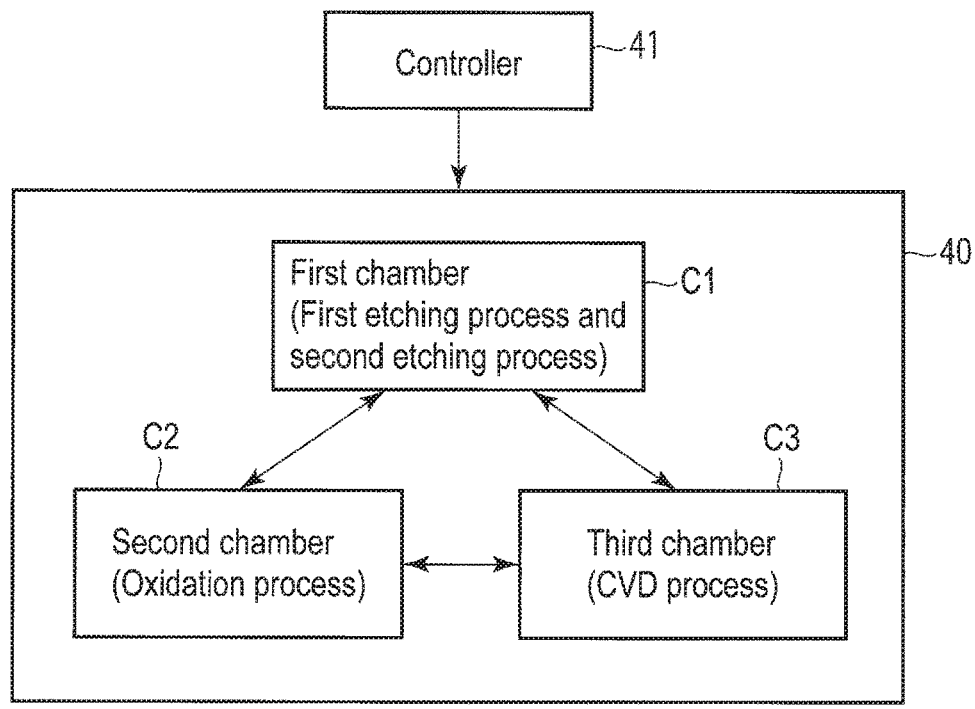
FIGS. 19 and 20 are block diagrams showing examples of a manufacturing apparatus.

Therefore, as shown in, e.g., FIG. 19, first chamber C1, second chamber C2 and third chamber C3 are provided in single manufacturing apparatus 40. In first chamber C1, the first and second etching processes are carried out; in second chamber C2, the process of oxidizing the first re-deposition layer is carried out, and in third chamber C3, the lamination structure including the magnetoresistive element is formed.

In this case, third chamber C3 can also be applied to formation of a spacer layer and a protection layer. Furthermore, it is preferable that first chamber C1 be also applicable to etching (e.g., the RIE) for forming a spacer layer in a self-aligning mariner on a sidewall portion of the magnetoresistive element.

The manufacturing apparatus 40 is featured in that in space not containing oxygen, wafer can be transferred between first to third chambers C1 to C3. That is, the manufacturing method can be carried out in single manufacturing apparatus 40 such that it is not in outside air.

Figure 20:
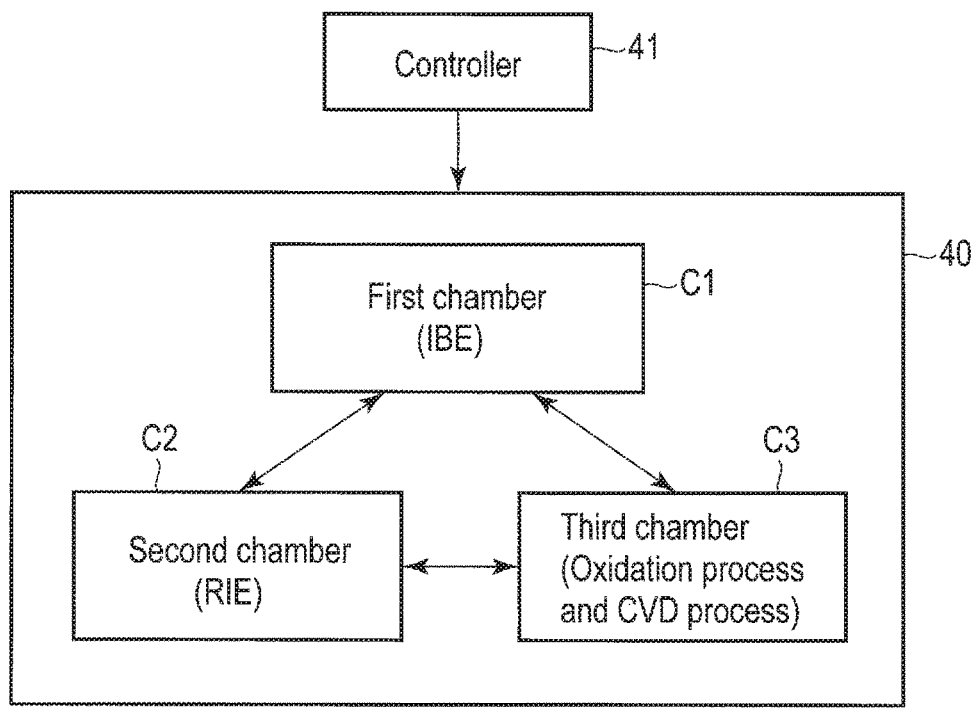

FIG. 20 shows a modification of the manufacturing apparatus.

In the modification, in first chamber C1, the IBE is performed. That is, the first and second etching processes can be performed in first chamber C1. In second chamber C2, the RIE is performed. That is, etching for forming the spacer layer in a self-aligning manner on the sidewall portion of the magnetoresistive element can be performed in second chamber C2.

In third chamber C3, the CVD and oxidation are carried out. That is, formation of the lamination structure including the magnetoresistive element, the spacer layer, the protection layer, etc. can be performed in third chamber C3. Also, the first re-deposition layer can be oxidized in third chamber C3.

In the manufacturing apparatuses as shown in FIGS. 19 and 20, transfer of wafer is controlled by controller 41 according to the procedure of the above manufacturing method. Controller 41 controls the processes to be carried out in first to third chamber C1 to C3, in addition to transfer of wafer.

6. Conclusion

According to the embodiment, it is possible to achieve a magnetic memory having a high reliability by preventing an electrical short failure from occurring in a magnetoresistive element, and also preventing variance of MR ratios.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions.

What is claimed is:

1. A magnetic memory comprising:
a first metal layer containing a first metal material;
a second metal layer on the first metal layer, the second metal layer containing a second metal material which is more easily oxidized than the first metal material, the second metal layer comprising a lower portion contacting the first metal layer and having a first sidewall portion, and an upper portion having a second sidewall portion which is located inward with respect to the first sidewall portion;
a magnetoresistive element on the second metal layer;
a third metal layer on the magnetoresistive element;
a first material layer which contacts a sidewall portion of the magnetoresistive element and the second sidewall portion of the second metal layer, the first material layer containing the same metal material as the second metal material;
a spacer layer covering the first material layer; and
a second material layer which contacts a sidewall portion of the spacer layer and the first sidewall portion of the second metal layer, the second material layer containing the same metal material as the first metal material.

2. The memory of claim 1, further comprising:
a protection layer covering the first metal layer, the second metal layer, the magnetoresistive element, the third metal layer, the first material layer, the spacer layer, and the second material layer, wherein the protection layer comprises a nitride.

3. The memory of claim 1, wherein the second metal material has a standard electrode potential lower than a standard electrode potential of the first metal material.

4. The memory of claim 1, wherein the first material layer includes an oxide of the second metal material.

5. The memory of claim 1, wherein the second material layer includes an oxide of the first metal material.

6. The memory of claim 1, wherein each of the first and second material layers has a thickness of 1 nm or less in a direction which is parallel to an upper surface of the first metal layer.

7. The memory of claim 1, wherein each of the first and second sidewall portions has a tilt of 15° or less with respect to an axis which is perpendicular to an upper surface of the first metal layer.

8. The memory of claim 1, wherein a width from the first sidewall portion to the second sidewall portion is substantially equal to a width of the spacer layer in a direction which is parallel to an upper surface of the first metal layer.

9. The memory of claim 1, wherein the magnetoresistive element has a size less than a size of the first metal layer in a direction which is parallel to an upper surface of the first metal layer.

10. The memory of claim 1, wherein the second metal layer has a size less than a size of the first metal layer in a direction which is parallel to an upper surface of the first metal layer.

11. The memory of claim 1, wherein the first metal layer is a contact plug which contacts a source/drain region of a select transistor.

12. The memory of claim 1, wherein the first metal material includes one of W, Ta, Ru, and Ti.

13. The memory of claim 1, wherein the second metal material includes one of Al, Be, Mg, Ca, Sr, Ba, Sc, Y, La, Zr, and Hf.

14. The memory of claim 1, further comprising an underlying layer between the second metal layer and the magnetoresistive element, the underlying layer including one of MgO, AlN, MgN, ZrN, NbN, SiN, and AlTiN.

15. The memory of claim 1, wherein the magnetoresistive element comprises a first magnetic layer on the second metal layer, a nonmagnetic layer on the first magnetic layer, and a second magnetic layer on the nonmagnetic layer.

16. The memory of claim 15, wherein each of the first and second magnetic layers has a residual magnetization in a direction in which the first and second magnetic layers are stacked.

17. The memory of claim 15, wherein the first magnetic layer has a variable magnetization, and the second magnetic layer has an invariable magnetization.

18. The memory of claim 17, wherein the magnetoresistive element comprises a shift cancelling layer provided between the second magnetic layer and the third metal layer, and the shift cancelling layer having an invariable magnetization which is contrary to the magnetization of the second magnetic layer.

* * * * *